(12) United States Patent
Sugioka et al.

(10) Patent No.: US 11,292,890 B2
(45) Date of Patent: *Apr. 5, 2022

(54) CURABLE RESIN COMPOSITION AND SEALING MATERIAL USING SAME

(71) Applicant: Nippon Shokubai Co., Ltd., Osaka (JP)

(72) Inventors: Takuo Sugioka, Osaka (JP); Teruhisa Fujibayashi, Osaka (JP)

(73) Assignee: Nippon Shokubai Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/787,821

(22) Filed: Feb. 11, 2020

(65) Prior Publication Data

US 2020/0172703 A1 Jun. 4, 2020

Related U.S. Application Data

(63) Continuation of application No. 15/552,176, filed as application No. PCT/JP2016/053067 on Feb. 2, 2016, now Pat. No. 10,597,517.

(30) Foreign Application Priority Data

Feb. 20, 2015 (JP) .............................. JP2015-031932
Jan. 28, 2016 (JP) .............................. JP2016-014476

(51) Int. Cl.
*C08K 5/29* (2006.01)
*H01L 23/31* (2006.01)
(Continued)

(52) U.S. Cl.
CPC ................ *C08K 5/29* (2013.01); *C08G 77/20* (2013.01); *C08G 77/26* (2013.01); *C08K 5/3415* (2013.01);
(Continued)

(58) Field of Classification Search
None
See application file for complete search history.

(56) References Cited

U.S. PATENT DOCUMENTS

| 4,370,467 A | 1/1983 | Gaku et al. |
| 6,172,143 B1 | 1/2001 | Amano et al. |

(Continued)

FOREIGN PATENT DOCUMENTS

| EP | 1 030 358 | 8/2000 |
| EP | 2 716 676 | 4/2014 |

(Continued)

OTHER PUBLICATIONS 2 page partial English translation for paragraphs [0099-0100] of JP 2012-188629, Oct. 4, 2012, Japan.*

(Continued)

*Primary Examiner* — Tae H Yoon
(74) *Attorney, Agent, or Firm* — Hamre, Schumann, Mueller & Larson, P.C.

(57) ABSTRACT

The present invention aims to provide a resin composition containing a cyanate ester compound which can reduce the formation of carbamate compounds so that the resin composition can be suitably used as an sealing material. The present invention relates to a curable resin composition containing a cyanate ester compound and a dehydrating agent.

6 Claims, 2 Drawing Sheets

(51) Int. Cl.

| | |
|---|---|
| *H01L 23/29* | (2006.01) |
| *C09K 3/10* | (2006.01) |
| *C08L 83/04* | (2006.01) |
| *C08L 79/04* | (2006.01) |
| *C08K 5/51* | (2006.01) |
| *C08K 5/3415* | (2006.01) |
| *C08G 77/20* | (2006.01) |
| *C09D 183/08* | (2006.01) |
| *C08G 77/26* | (2006.01) |
| *C08K 5/5415* | (2006.01) |
| *C08K 5/544* | (2006.01) |

(52) U.S. Cl.
CPC .............. *C08K 5/51* (2013.01); *C08K 5/5415* (2013.01); *C08L 79/04* (2013.01); *C08L 83/04* (2013.01); *C09D 183/08* (2013.01); *C09K 3/10* (2013.01); *C09K 3/1006* (2013.01); *H01L 23/29* (2013.01); *H01L 23/293* (2013.01); *H01L 23/31* (2013.01); *H01L 2224/48247* (2013.01)

(56) References Cited

U.S. PATENT DOCUMENTS

| | | | |
|---|---|---|---|
| 7,273,902 B2 | 9/2007 | Takahashi et al. | |
| 8,404,764 B1 | 3/2013 | Yu et al. | |
| 9,452,975 B2* | 9/2016 | Laufer | C07C 267/00 |
| 10,597,517 B2* | 3/2020 | Sugioka | C08L 79/04 |
| 2009/0215943 A1 | 8/2009 | Hirose et al. | |
| 2011/0224333 A1 | 9/2011 | Kitagawa et al. | |
| 2011/0247756 A1 | 10/2011 | Wilson et al. | |
| 2012/0164463 A1 | 6/2012 | Tang et al. | |
| 2013/0261260 A1 | 10/2013 | Isozaki | |
| 2014/0077128 A1 | 3/2014 | Inoue | |
| 2016/0002402 A1 | 1/2016 | Yasui | |

FOREIGN PATENT DOCUMENTS

| | | |
|---|---|---|
| EP | 2 716 709 | 4/2014 |
| JP | 62-275123 | 11/1987 |
| JP | 2-218751 | 8/1990 |
| JP | 6-016829 | 1/1994 |
| JP | 6-316669 | 11/1994 |
| JP | 7-070317 | 3/1995 |
| JP | 9-100349 | 4/1997 |
| JP | 11-003909 | 1/1999 |
| JP | 11-060946 | 3/1999 |
| JP | 11-199756 | 7/1999 |
| JP | 2004-322602 | 11/2004 |
| JP | 2008-291222 | 12/2008 |
| JP | 2009-067890 | 4/2009 |
| JP | 2010-189470 | 9/2010 |
| JP | 2011-038035 | 2/2011 |
| JP | 2011-184650 | 9/2011 |
| JP | 2012-140519 | 7/2012 |
| JP | 2012-188629 | 10/2012 |
| JP | 2014-015603 | 1/2014 |
| WO | 2007/037500 | 4/2007 |
| WO | 2012/165609 | 12/2012 |
| WO | 2014/136747 | 9/2014 |

OTHER PUBLICATIONS

"Silane coupling agents", Shin-Etsu Chemical Homepage, Shin-Etsu Chemical Co., Ltd. 2020, 4 pages with translation.

* cited by examiner

1

CURABLE RESIN COMPOSITION AND SEALING MATERIAL USING SAME

CROSS-REFERENCE TO RELATED APPLICATIONS

This application is a continuation of U.S. application Ser. No. 15/552,176, filed on Aug. 18, 2017, now U.S. Pat. No. 10,597,517, which is a 371 of International Application No. PCT/JP2016/053067, filed on Feb. 2, 2016, which claims priority to Japanese Patent Application No. 2015-031932, filed on Feb. 20, 2015 and Japanese Patent Application No. 2016-014476, filed on Jan. 28, 2016, the contents of which are hereby incorporated by references in their entirety.

TECHNICAL FIELD

The present invention relates to a curable resin composition and an sealing material including the curable resin composition. More specifically, the present invention relates to a curable resin composition suitable as a material of an sealing material for boards with electronic components or semiconductor chips mounted thereon or other similar applications, and also relates to an sealing material including the curable resin composition.

BACKGROUND ART

Curable resin compositions contain light- or heat-curable resins. In various industrial fields, curable resin compositions have been developed which have various physical properties required by the particular applications. One of the applications of curable resin compositions is sealing materials for use in boards on which electronic components, semiconductor chips, or other components are mounted. Electronic components, semiconductor chips, or other components are often mounted on boards by a surface-mount technology that allows for high density mounting, and in this case, electrically insulating sealing materials are used to seal them. As such sealing materials, curable resin compositions containing epoxy resins as main organic components are conventionally and widely used. However, when a cured product formed from such a resin composition is allowed to stand at a high temperature such as 200° C. or higher for a long period of time, the mechanical strength is reduced, resulting in the formation of cracks or separation from the object intended to be sealed. Therefore, improved heat resistance is needed.

Highly heat-resistant sealing materials that have been considered include curable resin compositions containing cyanate ester compounds with high glass transition temperatures. Curable resin compositions containing cyanate ester compounds that are disclosed include, for example, epoxy resin compositions essentially containing a trifunctional or tetrafunctional epoxy resin, a curing agent, a compound having at least two cyanate groups per molecule, and an inorganic filler (see Patent Literature 1); and thermosetting resin compositions obtained by incorporating an organoaluminum compound and an organosilicon compound containing, for example, a silanol group as curing catalysts into a thermosetting resin composition formed of a cyanate ester compound and/or its prepolymer alone or in combination with an epoxy resin (see Patent Literature 2). Furthermore, examples of resin composition for sealing materials that are disclosed are resin compositions for liquid sealing materials which are formed from an epoxy compound and a polycarbodiimide resin with a proportion of the polycarbodiimide resin of 0.1 to 10 parts by weight per 100 parts by weight of the epoxy compound, and which is liquid or fluid at ordinary temperature (see Patent Literature 3); sheet-shaped sealing materials made of an organic resin mainly containing a polycarbodiimide (see Patent Literature 4); and filling materials for semiconductor sealing materials including an inorganic substance and an organic layer chemically bonded to the surface of the inorganic substance and containing a carbodiimide group as a functional group reactive with an epoxy resin (see Patent Literature 5).

CITATION LIST

Patent Literature

Patent Literature 1: WO 2007/037500
Patent Literature 2: JP H09-100349 A
Patent Literature 3: JP H11-199756 A
Patent Literature 4: JP H11-3909 A
Patent Literature 5: JP 2009-67890 A

SUMMARY OF INVENTION

Technical Problem

If resin compositions containing cyanate ester compounds absorb moisture during handling in a working environment, side reactions can occur to produce carbamate compounds. As a result, non-uniform structures such as gels are present inside the cured resin products. When such resin compositions are used in, for example, semiconductor sealing materials, the non-uniform structures can cause voids or cracks at the interface between the integrated components in the semiconductor package and the sealing material, which may result in to a decrease in reliability of the semiconductors.

The present invention has been made in view of the current state of the art described above, and aims to provide a resin composition containing a cyanate ester compound in which the formation of carbamate compounds can be reduced so that the resin composition can be suitably used as an sealing material.

Solution to Problem

The present inventors studied various methods for reducing the formation of carbamate compounds in a resin composition containing a cyanate ester compound, and found that by incorporating a dehydrating agent into a resin composition containing a cyanate ester compound, the formation of carbamate compounds is reduced so that the resin composition can be suitably used as an sealing material. Thus, the present inventors arrived at an admirable solution to the above problems, thereby completing the present invention.

That is, the present invention relates to a curable resin composition, containing a cyanate ester compound and a dehydrating agent.

The present invention will be described in detail below.
Any combination of two or more of the individual preferred embodiments of the present invention described below is also a preferred embodiment of the present invention.

The curable resin composition of the present invention contains a cyanate ester compound and a dehydrating agent. The dehydrating agent is highly reactive with water, and reacts preferentially with water when it is incorporated into a resin composition containing a cyanate ester compound.

Thus, since water is consumed by the dehydrating agent in preference to the cyanate ester compound, the addition of the dehydrating agent to the cyanate ester compound reduces the formation of carbamate compounds caused by side reactions.

The curable resin composition of the present invention may contain one or two or more cyanate ester compounds and one or two or more dehydrating agents.

<Cyanate Ester Compound>

The cyanate ester compound contained in the curable resin composition of the present invention, which has at least two cyanato groups (—OCN) per molecule, may suitably, for example, a compound represented by the following formula (1):

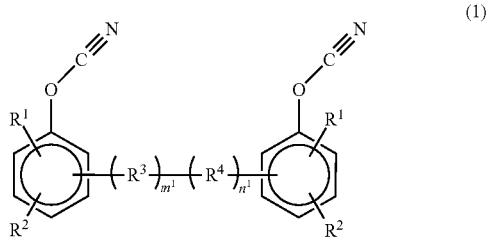

wherein $R^1$ and $R^2$ are the same as or different from each other and each represent a hydrogen atom, a C1-C4 alkyl group, a halogenated alkyl group, or a halogen group (X); each $R^3$ is the same or different and represents an organic group represented by any of the chemical formulas below; each $R^4$ is the same or different and represents an organic group represented by the chemical formula below; $m^1$ is 0 or 1; and $n^1$ represents an integer of 0 to 10.

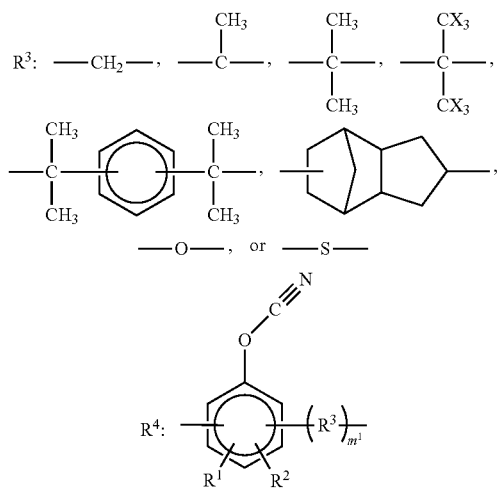

The compound of formula (1) is not particularly limited, and examples include cyanate esters of dihydric phenols such as bis(4-cyanatophenyl)methane, bis(3,5-dimethyl-4-cyanatophenyl)methane, bis(3-methyl-4-cyanatophenyl) methane, bis (4-cyanatophenyl)-1,1-ethane, bis(4-cyanatophenyl)-2,2-ethane, 2,2-bis(4-cyanatophenyl)propane, 2,2-bis(3,5-dimethyl-4-cyanatophenyl)methane, di(4-cyanatophenyl)ether, di(4-cyanatophenyl)thioether, 4,4-{1,3-phenylenebis(1-methylethylidene)}bisphenyl cyanate, 4,4-dicyanatophenyl, 2,2-bis(4-cyanatophenyl)-1,1,1,3,3,3-hexafluoropropane, 1,1'-bis-(p-cyanatophenyl)-ethane, 2,2'-bis(p-cyanatophenyl)propane, 4,4'-methylenebis(2,6-dimethylphenylcyanate), 2,2'-bis(p-cyanatophenyl)-hexafluoropropane, and α,α'-bis(4-cyanatophenyl)-m-diisopropylbenzene; cyanate esters of trihydric phenols such as tris(4-cyanatophenyl)-1,1,1-ethane and bis(3,5-dimethyl-4-cyanatophenyl)-4-cyanatophenyl-1,1,1-ethane; and phenol novolac-type cyanate esters, cresol novolac-type cyanate esters, and dicyclopentadiene bisphenol-type cyanate esters. In view of dielectric properties of the cured product, curability, and other properties, 2,2-bis(4-cyanatophenyl)propane or phenol novolac-type cyanate esters are suitable among these.

The cyanate ester compound may also be a multimer (e.g. trimer, pentamer) having a triazine ring structure formed by cyclization of the cyanato groups of the compound of formula (1) In particular, in view of workability and solubility in other curable resins, it may suitably be a trimer. The multimer may be produced by usual techniques.

The cyanate ester compound may be liquid or solid. In view of melt kneading with other curable resins, the cyanate ester compound may suitably have high compatibility or a melting point or softening point of 120° C. or lower. The melting point or softening point is more preferably 100° C. or lower.

The melting point refers to a temperature (° C.) at which crystals melt and become liquid in an inert atmosphere. Accordingly, amorphous compounds and compounds that are already in liquid form at room temperature do not have a melting point. The melting point of the cyanate ester compound may be determined by, for example, differential scanning calorimetry (DSC). The softening point (° C.) is determined in accordance with JIS K 723' (1986), and may be measured using, for example, a thermal softening temperature measurement apparatus (product name "ASP-MG4", Meitec Corporation).

In the curable resin composition of the present invention, the amount of the cyanate ester compound present is preferably 5% to 95% by mass based on 100% by mass of the total organic component in the curable resin composition. With such an amount of the cyanate ester compound, the curable resin composition can simultaneously achieve resistance to heat or humidity and handleability as a semiconductor sealing material, thereby providing high reliability to a semiconductor package including the composition. The amount of the cyanate ester compound is more preferably 10% to 90% by mass, still more preferably 15% to 85% by mass.

<Dehydrating Agent>

The dehydrating agent contained in the curable resin composition of the present invention may be any agent that reacts preferentially over the cyanate ester compound with water, and specific examples include carbodiimide compounds, imidazole compounds, triazine compounds, phosphonium compounds, uronium compounds, and silane compounds.

The imidazole compound may be any compound having a structure in which the nitrogen atoms of two imidazole rings are linked by a carbonyl group. Examples include N,N'-carbonyldiimidazole.

The triazine compound may be any compound having a structure in which the nitrogen atom of a quaternary ammonium group is bonded to the carbon atom of a triazine ring, and examples include 4-(4,6-dimethoxy-1,3,5-triazin-2-yl)-4-methylmorpholinium chloride n-hydrate and (4,6-dimethoxy-1,3,5-triazin-2-yl)-(2-octoxy-2-oxoethyl)dimethyl-ammonium trifluoromethanesulfonate.

The phosphonium compound may be any compound containing a phosphonium group, preferably a phosphonium group having a structure in which the phosphorus atom is bonded to three nitrogen atoms. Examples of the phosphonium compound include 1H-benzotriazol-1-yloxytris(dimethylamino)phosphonium hexafluorophosphate, 1H-benzotriazol-1-yloxytripyrrolidinophosphonium hexafluorophosphate, and chlorotripyrrolidinophosphonium hexafluorophosphate.

The uronium compound may be any compound having a structure represented by the following formula (2):

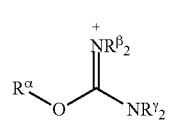

(2)

wherein $R^\alpha$, $R^\beta$ and $R^\gamma$ are the same as or different from each other and each represent a hydrogen atom or an organic group. Examples include {{[(1-cyano-2-ethoxy-2-oxoethylidene)amino]oxy}-4-morpholinomethylene}-dimethylarmmonium hexafluorophosphate, O-(7-azabenzotriazol-1-yl)-N,N,N',N',-tetramethyluronium hexafluorophosphate, O-(7-azabenzotriazol-1-yl)-N,N,N',N',-tetramethyluronium hexafluorophosphate, O—(N-succinimidyl)-N,N,N',N',-tetramethyluronium tetrafluoroborate, and O-(3,4-dihydro-4-oxo-1,2,3-benzotriazin-3-yl)-N,N,N',N',-tetramethyluronium tetrafluoroborate.

The silane compound may be any compound containing a silyl group and a hydrolyzable group such as an alkoxy or amide group or a halogen atom, and specific examples include alkoxysilane compounds, silylamines, silylamides, and halosilane compounds.

Examples of the alkoxysilane compound include tetramethoxysilane, tetraethoxysilane, tetrapropoxysilane, tetrabutoxysilane, methyltrimethoxysilane, dimethyldimethoxysilane, phenyltrimethoxysilane, diphenyldimethoxysilane, methyltriethoxysilane, dimethyldiethoxysilane, phenyltriethoxysilane, diphenyldiethoxysilane, isobutyltrimethoxysilane, vinyltrimethoxysilane, vinyltriethoxysilane, vinyltris(β-methoxyethoxy) silane, 3,3,3-trifluoropropyltrimethoxysilane, methyl-3,3,3-trifluoropropyldimethoxysilane, β-(3,4-epoxycyclohexyl) ethyltrimethoxysilane, γ-glycidoxymethyltrimethoxysilane, γ-glycidoxymethyltriethoxysilane, γ-glycidoxyethyltrimethoxysilane, γ-glycidoxyethyltriethoxysilane, γ-glycidoxypropyltrimethoxysilane, γ-glycidoxypropyltrimethoxysilane, γ-glycidoxypropyltriethoxysilane, γ-glycidoxypropyltriethoxysilane, γ-(β-glycidoxyethoxy) propyltrimethoxysilane, γ-(meth)acryloxymethyltrimethoxysilane, γ-(meth)acryloxymethyitriethoxysilane, γ-(meth) acryloxyethyltrimethoxysilane, γ-(meth) acryloxyethyltriethoxysilane, γ-(meth) acryloxypropyltrimethoxysilane, γ-(meth) acryloxypropyltrimethoxysilane, γ-(meth) acryloxypropyltriethoxysilane, butyltrimethoxysilane, isobutyltriethoxysilane, hexyltriethoxysilane, octyltriethoxysilane, decyltriethoxysilane, butyltriethoxysilane, isobutyltriethoxysiilane, hexyitriethoxysilane, octylethoxysilane, decyltriethoxysilane, 3-ureidoisopropylpropyltriethoxysilane, perfluorooctylethyltrimethoxysilane, perfluorooctylethyltriethoxysilane, perfluorooctylethyitriisopropoxysilane, trifluoropropyltrimethoxysilane, N-β-(aminoethyl)-γ-aminopropylmethyldimethoxysilane, N-β-(aminoethyl)-γ-aminopropyltrimethoxysilane, N-phenyl-γ-aminopropyltrimethoxysilane, γ-mercaptopropyltrimethoxysilane, and trimethylsilanol.

Examples of the silylamine include 1,1,1,3,3,3-hexamethyldisilazane, 1,3-diphenyltetramethyvdisilazane, N-(trimethylsilyl)dimethylamine, N-(trimethylsilyl)-diethylamine, N-trimethylsilylimidazole, 1-(t-butyldimethylsilyl)imidazole, 1-(dimethylethylsilyl)-imidazole, 1-(dimethylisopropylsilyl)imidazole, 1-(dimethyl-n-propylsilyl)imidazole, pentafluorophenyldimethylsilyldiethylamine, and 1-cyanoethyl(diethylamino)dimethylsilane.

Examples of the silylamide include N,O-bis(trimethylsilyl)acetamide, N,O-bis(t-butyldimethylsilyl)acetamide, N,O-bis(trimethylsilyl)-trifluoroacetamide, N-methyl-N-trimethylsilylacetamide, N-methyl-N-trimethylsilylheptafluorobutylamide, N-methyl-N-trimethylsilyltrifluoroacetamide, N-(t-butyldimethylsilyl)-N-methyltrifluoroacetamide, and N-trimethylsilylacetamide.

The halosilane compound may contain any halogen atom such as fluorine, chlorine, bromine, or iodine, preferably chlorine, That is, the halosilane compound is preferably a chlorosilane compound, and specific examples include tetrachlorosilane, methyltrichlorosilane, dimethyldichlorosilane, trimethylchlorosilane, vinyltrichlorosilane, 2-chloroethyltrichlorosilane, ethyltrichlorosilane, 2-cyanoethyltrichlorosilane, allyitrichlorosilane, 3-bromopropyltrichlorosilane, methylvinyltrichlorosilane, ethylmethyldichlorosilane, trimethylbromosilane, divinyldichlorosilane, methyl-3,3,3-trifluoropropyldichlorosilane, isobutyltrichlorosilane, pentyltrichlorosilane, phenyltrichlorosilane, methylphenyldichlorosilane, dimethylphenylchlorosilane, cyclohexyltrichlorosilane, benzyltrichlorosilane, p-tolyltrichlorosilane, 6-trichlorosilyl-2-norbobornene, 2-trichlorosilylnorbornane, 2-(4-cyclohexylnylethyl)trichlorosilane, dodecyltrichlorosilane, tetradecyltrichlorosilane, 1,2-bis(trichlorosilyl)ethane, 1,2-bis(dimethylchlorosilyl) ethane, 1,4-bis(dimethylchlorosilyl)benzene, and other chlorosilane compounds. These compounds may be used alone, or two or more of these may be used in combination.

The carbodiimide compound may be any compound having at least one carbodiimide group represented by (—N=C=N—) in the molecule, and is preferably a compound represented by the following formula (3):

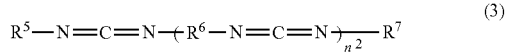

(3)

wherein $R^5$ and $R^7$ are the same as or different from each other and each represent a C1-C50 monovalent hydrocarbon group which may have a substituent; each $R^6$ is the same or different and represents a C1-C50 divalent hydrocarbon group which may have a substituent; and $n^2$ represents a number of 0 to 10,000.

In formula (3), the carbon number of each of the hydrocarbon groups represented by $R^5$ to $R^7$ is preferably 1 to 40, more preferably 1 to 30, still more preferably 1 to 20.

The monovalent hydrocarbon group for $R^5$ and $R^7$ may be an acyclic or cyclic aliphatic alkyl, alkenyl, or alkynyl group, an aromatic aryl group, or a group formed by combination of two or more of the foregoing groups.

The divalent hydrocarbon group for $R^6$ may be any divalent group formed by removing a hydrogen atom from the above monovalent hydrocarbon group.

In formula (3), $R^5$ to $R^7$ may each have a substituent, and examples of the substituent include a hydroxy group, an amino group, a nitro group, and a halogen atom.

$R^5$ to $R^7$ may each have one or two or more of these substituents. Moreover, $R^5$ to $R^7$ may each have one or two or more types of substituents.

In formula (3), $n^2$ is preferably 0 to 200, more preferably 0 to 150, still more preferably 0 to 100.

Specific examples of the carbodiimide compound include monocarbodiimide compounds such as N,N'-diphenylcarbodiimide, N,N'-di-cyclohexylcarbodiimide, N,N'-di-2,6-dimethylphenycarbodiimide, N,N'-diisopropylcarbodiimide, N,N'-dioctyldecylcarbodiimide, N,N'-di-o-toluylcarbodiimide, N,N'-di-p-toluylcarbodiimide, N,N'-di-p-nitrophenylcarbodiimide, N,N'-di-p-aminophenyl-carbodiimide, N,N'-di-p-hydroxyphenylcarbodiimide, N,N'-di-p-chlorophenylcarbodiimide, N,N'-di-o-chlorophenylcarbodiimide, N,N'-di-3,4-dichlorophenylcarbodiimide, N,N'-di-2,5-dichlorophenyicarbodiimide, N,N'-p-phenylene-bis-o-toluylcarbodiimide, N,N'-p-phenylene-bis-dicyclohexylcarbodiimide, N,N'-p-phenylene-bis-di-p-chlorophenylcarbodiimide, N,N'-2,6,2',6'-tetraisopropyl-diphenylcarbodiimide, N,N'-hexamethylene-bis-cyclohexyicarbodiimide, N,N'-ethylene-bis-diphenylcarbodiimide, N,N'-ethylene-bis-dicyclohexylcarbodiimide, N-toluyl-N'-cyciohexylcarbodiimide, N, N'-di-2,6-diisopropylphenylcarbodiimide, N,N'-di-2,6-di-tert-butylphenylcarbodiimide, N-toluyl-N'-phenylcarbodiimide, N,N'-benzylcarbodiimide, N-octadecyl-N'-phenyicarbodiimide, N-benzyl-N'-phenylcarbodiimide, N-octadecyl-N'-tolylcarbodiimide, N-cyclohexyl-N'-tolylcarbodiimide, N-phenyl-N'-tolylcarbodiimide, N-benzyl-N'-tolylcarbodiimide, N,N'-di-o-ethylphenyicarbodiimide, N,N'-di-p-ethylphenyicarbodiimide, N,N'-di-o-isopropylphenylcarbodiimide, N,N'-di-p-isopropylphenylcarbodiimide, N, N'-di-o-isobutylphenylcarbodiimide, N, N'-di-p-isobutylphenylcarbodiimide, N, N'-di-2,6-diethylphenylcarbodiimide, N,N'-di-2-ethyl-6-isopropylphenylcarbodiimide, N,N'-di-2-isobutyl-6-isopropylphenylcarbodiimide, N,N'-di-2,4,6-trimethylphenyl-carbodiimide, N,N'-di-2,4,6-triisopropylphenylcarbodiimide, and N,N'-di-2,4,6-triisobutylphenylcarbodiimide; and polycarbodiimide compounds such as poly(1,6-hexamethylenecarbodiimide), poly(4,4'-methylene-biscyclohexylcarbodiimide), poly(1,3-cyclohexylenecarbodiimide), poly(1,4-cyclohexylenecarbodiimide), poly(4,4'-diphenylmethanecarbodiimide), poly(3,3'-dimethyl-4,4'-diphenylmethanecarbodiimide), poly(naphthylene-carbodiimide), poly(p-phenylenecarbodiimide), poly(m-phenylenecarbodiimide), poly(tolylcarbodiimide), poly(diisopropylcarbodiimide), poly(methyldiisopropyl-phenylenecarbodiimide), poly(triethylphenylenecarbodiimide), and poly(triisopropylphenylenecarbodiimide). These carbodiimide compounds may be used alone, or two or more of these may be used.

Preferred among the carbodiimide compounds are polycarbodiimide compounds. Examples of polycarbodiimide compounds include aliphatic polycarbodiimides of formula (3) in which $R^6$ is an aliphatic group and aromatic polycarbodiimides of formula (3) in which $R^6$ is an aromatic group. The aliphatic polycarbodiimides are preferred because they are more likely to bleed than the aromatic polycarbodiimides. Furthermore, the aliphatic group is preferably linear rather than branched.

When the carbodiimide compound is a polycarbodiimide compound, it preferably has a weight average molecular weight of at least 100 but not more than 100,000, more preferably at least 500 but not more than 10,000, in view of safety and ease of handling.

The weight average molecular weight of the carbodiimide compound can be determined by gel permeation chromatography (GPC) under the following conditions.

Measuring equipment: HLC-8120GPC (trade name, from Tosoh Corporation)

Molecular weight column: TSK-GEL GMHXL-L and TSK-GEL G5000HXL (both from Tosoh Corporation) connected in series Eluent: Tetrahydrofuran (THF)

Reference material for calibration curve: Polystyrene (from Tosoh Corporation)

Measuring method: An object to be measured is dissolved in THF to give a solids content of about 0.2% by mass, and the solution is filtered to obtain a filtrate as a measurement sample, which is then measured for molecular weight.

The carbodiimide compound may be produced, for example, by decarboxylating an organic isocyanate by heating in the presence of an appropriate catalyst to form a carbodiimide linkage.

The formation of the carbodiimide linkage can be confirmed by the disappearance of the absorption peak of an isocyanate group at 2260 $cm^{-1}$ and the appearance of the absorption peak of a carbodiimide linkage.

The catalyst used in the reaction to form a carbodiimide linkage may be a phospholene or a phospholene oxide. Specific examples include 1-ethyl-3-methyl-3-phospholene oxide, L-phenyl-3-methyl-3-phospholene oxide, and 1-phenyl-3-methyl-2-phospholene oxide.

The organic solvent used in the reaction to form a carbodiimide linkage needs to have a high boiling point and not to contain an active hydrogen reactive with the starting compound having at least one isocyanate group or the produced carbodiimide compound.

Specific examples include aromatic hydrocarbons such as toluene, xylene, and diethylbenzene; glycol ether esters such as diethylene glycol diacetate, dipropylene glycol dibutyrate, hexylene glycol diacetate, glycol diacetate, methyl glycol acetate, ethyl glycol acetate, butyl glycol acetate, ethyl diglycol acetate, and butyl diglycol acetate; ketones such as ethyl butyl ketone, acetophenone, propiophenone, diisobutyl ketone, and cyclohexanone; and aliphatic esters such as aluminum acetate, propyl propionate, and ethyl butyrate. One or two or more of the foregoing solvents may be used.

In addition to the above basic production method, the carbodiimide compound may also be produced by, for example, the methods disclosed in U.S. Pat. No. 2,941,956, JP S47-33279 B, JP H05-178954 A, and JP H07-330849 A, and J. Org. Chem., 28, 2069 (1963), and Chem., Review 81, 619 (1981). In addition, the carbodiimide compound may be produced in the absence of a solvent as disclosed in, for example, JP H05-178954 A or JP H06-56950 A.

The carbodiimide compound may be a commercially available product. Examples of commonly commercially available aliphatic polycarbodiimide compounds include CARBODILITE LA-1, CARBODILITE HMV-8CA, CARBODILITE V-05, CARBODILITE V-07, isocyanate-free CARBODILITE HMV-15CA, CARBODILITE V-03, and CARBODILITE V-09 (all from Nisshinbo Chemical Inc.). Examples of commercially available aromatic polycarbodiimide compounds include Stabaxol P, Stabaxol P-400, and Stabaxol I (all from Rhein Chemie).

Preferred among the dehydrating agents are carbodiimide compounds or silylamide compounds. If resin compositions containing cyanate ester compounds absorb moisture during handling in a working environment, the cyanate ester compounds can be hydrolyzed to generate carbon dioxide so that the cured resin products may contain voids. Carbodiimide compounds and silylamide compounds do not generate carbon dioxide or highly volatile substances such as alcohol as by-products when reacted with water. Therefore, when the resin composition contains such a compound as a dehydrating agent, it is possible to reduce the generation of carbon dioxide caused by the hydrolysis of the cyanate ester compound and the generation of carbon dioxide or the like caused by the reaction of the dehydrating agent with water, thereby reducing the presence of voids in the cured resin product as well. More preferred among the dehydrating agents are carbodiimide compounds. Carbodiimide compounds react with water to form urea compounds as shown by the formula below. Since the active hydrogen site of such a urea compound formed by the reaction of a carbodiimide compound with water reacts with the cyanate ester compound, the urea compound is consumed in the formation of a cross-linked structure when the resin composition is cured, and thus does not inhibit the physical properties of the cured product, such as mechanical strength. Accordingly, the curable resin composition of the present invention can produce a cured product with higher physical properties in which the formation of non-uniform structures such as voids and gels is more sufficiently reduced.

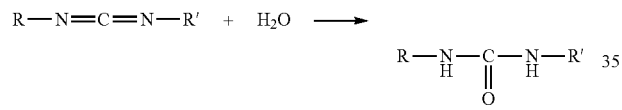

In the curable resin composition of the present invention, the amount of the dehydrating agent present is preferably 0.01% to 5% by mass based on 100% by mass of the cyanate ester compound in the curable resin composition. With such an amount of the dehydrating agent, the formation of non-uniform structures can be more sufficiently reduced, and the cured product can also have excellent appearance. The amount of the dehydrating agent based on 100% by mass of the cyanate ester compound is more preferably 0.05% to 4% by mass, still more preferably 0.1% to 3% by mass.

In the case of the curable resin composition of the present invention containing a carbodiimide compound, the amount of the carbodiimide compound present is preferably 0.01% to 5% by mass based on 100% by mass of the cyanate ester compound in the curable resin composition. With such an amount of the carbodiimide compound, the formation of non-uniform structures can be more sufficiently reduced, and the cured product can also have excellent appearance. The amount of the carbodiimide compound based on 100% by mass of the cyanate ester compound is more preferably 0.05% to 4% by mass, still more preferably 0.1% to 3% by mass.

<Maleimide Compound>

The curable resin composition of the present invention preferably further contains a maleimide compound. The resin composition containing a maleimide compound has improved handleability.

Suitable examples of the maleimide compound include bismaleimides such as N,N'-ethylenebismaleimide, N,N'-hexamethylenebismaleimide, N,N'-m-phenylenebismaleimide, N,N'-p-phenylenebismaleimide, 2,2-bis[4-(4-maleimidophenoxy)phenyl]propane, bis[4-(4-maleimidophenoxy)phenyl]methane, 1,1,1,3,3,3-hexafluoro-2,2-bis[4-(4-maleimidophenoxy)phenyl]propane, N,N'-p,p'-diphenyldimethylsilylbismaleimide, N,N'-4,4'-diphenyl ether bismaleimide, N,N'-methylenebis(3-chloro-p-p-phenylene)-bismaleimide, N,N'-4,4'-diphenylsulfonebismaleimide, N,N'-4,4'-dicyclohexylmethanebismaleimide, N,N'-dimethylene-cyclohexanebismaleimide, N,N'-m-xylenebismaleimide, and N,N'-4,4'-diphenylcyclohexanebismaleimide; and co-condensation products of N-phenylmaleimide and an aldehyde compound such as formaldehyde, acetaldehyde, benzaldehyde, or hydroxyphenylaldehyde. Also suitable are bismaleimide compounds represented by the following formula (4):

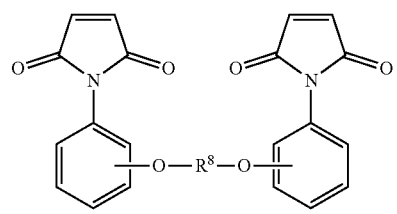

wherein $R^8$ represents a divalent group having the following structure:

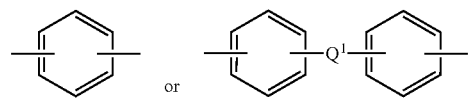

wherein $Q^1$ is a group directly bonded to two aromatic rings and represents at least one selected from the group consisting of a C1-C10 divalent hydrocarbon group, a hexafluorinated isopropylidene group, a carbonyl group, a thio group, a sulfinyl group, a sulfonyl group, and an oxide group.

Specific suitable examples include 1,3-bis(3-maleimidophenoxy)benzene, bis[4-(3-maleimidophenoxy)-phenyl]methane, 1,1-bis[4-(3-maleimidophenoxy)phenyl]ethane, 1,2-[4-(3-maleimidophenoxy)phenyl]ethane, 2,2-bis[4-(3-maleimidophenoxy)phenyl]propane, 2,2-bis[4-(3-maleimidophenoxy)phenyl]butane, 2,2-bis[4-(3-maleimidophenoxy)phenyl]-1,1,1,3,3,3-hexafluoropropane, 4,4-bis(3-maleimidophenoxy)biphenyl, bis[4-(3-maleimidophenoxy)phenyl]ketone, bis[4-(3-maleimidophenoxy)-phenyl]sulfide, bis[4-(3-maleimidophenoxy)phenyl]sulfoxide, bis[4-(3-maleimidophenoxy)phenyl]sulfone, bis[4-(3-maleimidophenoxy)phenyl]ether, and compounds represented by the following formula (5):

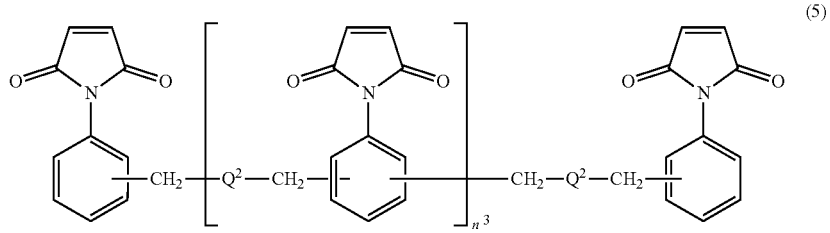

(5)

wherein $Q^2$ represents a divalent group having an aromatic ring which may have a substituent; and $n^3$ represents the number of repeating units and is an average number of 0 to 10. Specific preferred examples of $Q^2$ include divalent groups of phenyl, biphenyl, naphthyl, or other groups, such as phenylene, biphenylene, and naphthylidene groups.

When the maleimide compound in the present invention is a polymer compound, the weight average molecular weight of the maleimide compound is preferably 200 to 5000. When the molecular weight of the maleimide compound falls within such a range, a cured product having excellent properties such as heat resistance can be obtained. The weight average molecular weight is more preferably 220 to 4500, still more preferably 250 to 4000.

The weight average molecular weight of the maleimide compound can be measured by GPC according to the conditions described in EXAMPLES.

In the case of the curable resin composition of the present invention containing a maleimide compound, the amount of the maleimide compound present is preferably 5% to 40% by mass based on 100% by mass of the cyanate ester compound in the curable resin composition. With such an amount of the maleimide compound, the resin composition has excellent heat resistance and sufficiently improved handleability. The amount of the maleimide compound based on 100% by mass of the cyanate ester compound is more preferably 5% to 35% by mass, still more preferably 5% to 30% by mass.

<Siloxane Compound>

The curable resin composition of the present invention preferably further contains a siloxane compound represented by the following average composition formula (6):

(6)

wherein each X is the same or different and represents an organic structure containing an imide bond; each Y is the same or different and represents at least one selected from the group consisting of a hydrogen atom, a hydroxy group, a halogen atom, and an OR group; each Z is the same or different and represents an organic group containing no imide bond; each R is the same or different and represents at least one selected from the group consisting of an alkyl group, an acyl group, an aryl group, and an unsaturated aliphatic residue, and may have a substituent; a, b, and c each represent 0 or a number of less than 3; d represents a number of less than 2, excluding 0; and a+b+c+2d=4.

The curable resin composition containing such a siloxane compound has much better heat resistance.

The siloxane backbone (backbone essentially containing a siloxane bond) in the siloxane compound may preferably, for example, be in the form of a (linear or branched) chain, a ladder, a net, a ring, a cage, or a cube. Among these, the siloxane backbone is preferably in the form of a ladder, a net, or a cage because even a small amount of the siloxane compound can easily produce the effect. That is, the siloxane compound may particularly suitably be one containing a polysilsesquioxane.

The proportion of the siloxane backbone in the siloxane compound is preferably 10% to 80% by mass, more preferably 15% to 70% by mass, still more preferably 20% to 50% by mass based on 100% by mass of the siloxane compound.

In the average composition formula (6), the preferred form of X is as described later, and Y may suitably be a hydroxy group or an OR group. Among these, it is more preferably an OR group, still more preferably an OR group in which R is a C1-C8 alkyl group. Z is preferably at least one selected from the group consisting of an alkyl group, an aromatic residue such as an aryl or aralkyl group, and an unsaturated aliphatic residue (each of which may have a substituent). It is more preferably a C1-C8 alkyl group or an aromatic residue such as an aryl or aralkyl group, each of which may have a substituent. The coefficient a of X satisfies 0≤a<3, the coefficient b of Y satisfies 0≤b<3, the coefficient c of Z satisfies 0≤c<3, and the coefficient d of O satisfies 0<d<2. The coefficient a of X preferably satisfies 0<a<3. In other words, the coefficient a of X is preferably a number of less than 3, excluding 0.

The siloxane compound may be represented by, for example, the following formula (7):

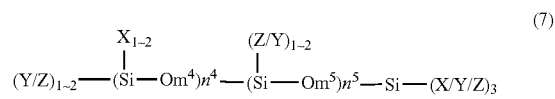

(7)

wherein X, Y, and Z are as defined above; $n^4$ and $n^5$ each represent a polymerization degree; $n^4$ is a positive integer excluding 0; and $n^5$ is 0 or a positive integer.

Here, "Y/Z-" means that Y or Z is bonded; "$X_{1\sim2}$—" means that one or two Xs are bonded; "$(Z/Y)_{1\sim2}$—" means that one or two Zs or Ys are bonded, or one Z and one Y (two groups in total) are bonded; and "Si—$(X/Y/Z)_3$" means that any three selected from X, Y, and Z are bonded to the silicon atom.

The arrangement of Si-$Om^4$ and Si-$Om^5$ in formula (7) does not define the order in which Si-$Om^4$ and Si-$Om^5$ are bonded. For example, in suitable embodiments, Si-$Om^4$ and Si-$Om^5$ are alternately or randomly co-condensed, or a polysiloxane of Si-$Om^4$ and a polysiloxane of Si-$Om^5$ are bonded. The condensation structure is not limited.

The siloxane compound may be represented by average composition formula (6). The siloxane backbone (backbone essentially containing a siloxane bond) of the siloxane compound may be represented by $(SiO_m)_n$. Such a siloxane compound contains, in addition to $(SiO_m)_n$, the following structures: the imide bond-containing organic structure X (structure essentially containing an imide bond), Y such as a hydrogen atom or a hydroxy group, and the imide bond-free organic group Z, each of which is bonded to the silicon atom of the backbone.

X, Y, and Z may or may not be present in the repeating units in the form of "a chain". For example, at least one X may be present as a side chain per molecule. In the $(SiO_m)_n$, n represents a polymerization degree which means the polymerization degree of the backbone, and the number of imide bond-containing organic structures is not necessarily n. In other words, not every $(SiO_m)_n$ unit needs to have one imide bond-containing organic structure. It is sufficient that one or more imide bond-containing organic structures be present per molecule. In cases where a plurality of imide bond-containing organic structures are present, two or more imide bond-containing organic structures may be bonded to one silicon atom, as described above. The same shall apply to the following.

In the backbone $(SiO_m)_n$, m is preferably a number of at least 1 but less than 2, more preferably 1.5 to 1.8.

The symbol n represents a polymerization degree and is preferably 1 to 5000, more preferably 1 to 2000, still more preferably 1 to 1000, particularly preferably 1 to 200.

The silane compound with n=2 may be such that there are two constituent units in each of which at least one imide bond-containing organic structure (X) is bonded to a silicon atom (hereinafter, also referred to as "constituent unit (I)"), or there is only one constituent unit (I). Specifically, for example, the following formulas (8) are suitable.

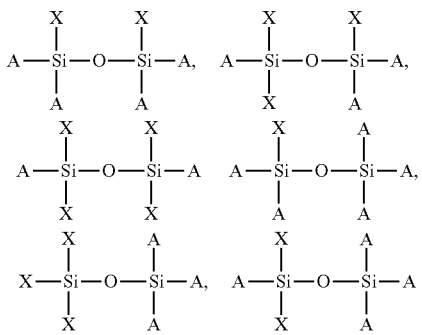

(8)

In the formulas, A is Y or Z, and X, Y, and Z are as defined above. These compounds include homopolymers containing two constituent units (I) of the same type, homopolymer containing two constituent units (I) of different types, and copolymers containing only one constituent unit (I) (in the form of a co-condensed structure).

In average composition formula (6), the proportion of the imide bond-containing organic structure is preferably 20 to 100 mol, more preferably 50 to 100 mol, still more preferably 70 to 100 mol per 100 mol of silicon atoms in the silane compound.

In average composition formula (6), X may suitably a constituent unit represented by the formula (9) below. That is, the siloxane compound in the present invention may suitably include a siloxane compound of average composition formula (6) in which X is a constituent unit represented by the following formula (9):

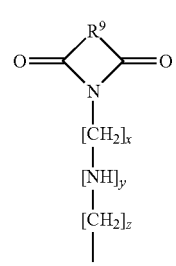

(9)

wherein $R^9$ represents at least one selected from the group consisting of an aromatic structure, a heterocyclic structure, and an alicyclic structure; x and z are the same as or different from each other and each represent an integer of at least 0 but not more than 5; and y represents 0 or 1. With such a siloxane compound having a ring structure in the structure, a cured product having further improved heat resistance can be obtained.

In the constituent unit of formula (9), x and z are the same as or different from each other and each represent an integer of at least 0 but not more than 5; y represents 0 or 1, preferably 0; and x+z may be an integer of at least 0 but not more than 10, preferably 3 to 7, more preferably 3 to 5, particularly preferably 3.

In formula (9), $R^9$ represents at least one selected from the group consisting of an aromatic structure, a heterocyclic structure, and an alicyclic structure. In other words, $R^9$ represents at least one selected from the group consisting of a group having an aromatic ring structure (aromatic ring), a group having a heterocyclic ring structure (heterocycle), and a group having an alicyclic ring structure (alicycle).

Specific preferred examples of $R^9$ include a phenylene group, a naphthylidene group, a divalent norbornene group, an (alkyl)cyclohexylene group, and a cyclohexenyl group.

The constituent unit of formula (9) is represented by: the following formula (9-1) when $R^9$ is a phenylene group; the following formula (9-2) when $R^9$ is an (alkyl)cyclohexylene group; the following formula (9-3) when $R^9$ is a naphthylidene group; the following formula (9-4) when $R^9$ is a divalent norbornene group; the following formula (9-5) when $R^9$ is a cyclohexenyl group.

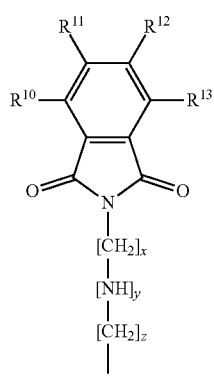

(9-1)

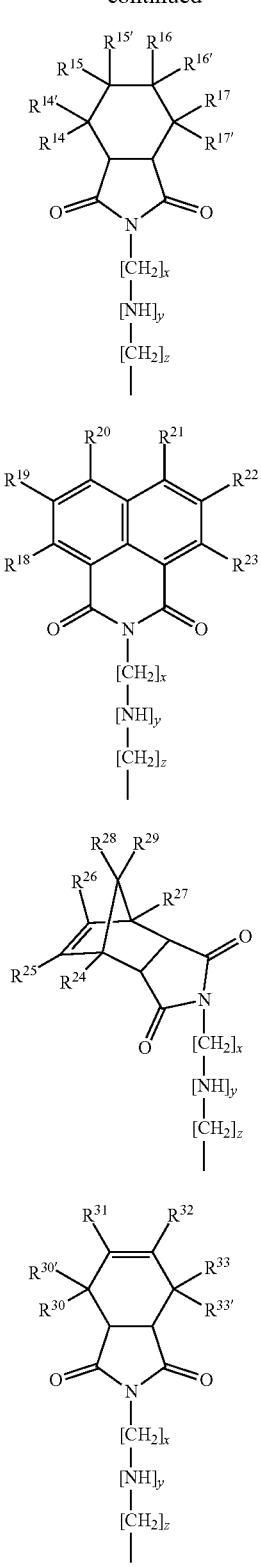

In formulas (9-1) to (9-5), x, y, and z are respectively the same as x, y, and z in formula (9).

In formula (9-1), $R^{10}$ to $R^{13}$ are the same as or different from each other and each represent at least one structure selected from the group consisting of a hydrogen atom, an alkyl group, a halogen atom, and an aromatic structure. In a preferred embodiment, $R^{10}$ to $R^{13}$ are all hydrogen atoms.

In formula (9-2), $R^{14}$ to $R^{17}$ and $R^{14'}$ to $R^{17'}$ are the same as or different from each other and each represent at least one structure selected from the group consisting of a hydrogen atom, an alkyl group, a halogen atom, and an aromatic structure. Regarding $R^{14}$ to $R^{17}$ and $R^{14'}$ to $R^{17'}$, in preferred embodiments, $R^{15}$ or $R^{16}$ is a methyl group while the other groups are all hydrogen atoms; or $R^{14}$ to $R^{17}$ and $R^{14'}$ to $R^{17'}$ are all hydrogen atoms; or $R^{14}$ to $R^{17}$ and $R^{14'}$ to $R^{17'}$ are all fluorine atoms. In a more preferred embodiment, $R^{15}$ or $R^{16}$ is a methyl group while the other groups are all hydrogen atoms.

In formula (9-3), $R^{18}$ to $R^{23}$ are the same as or different from each other and each represent at least one structure selected from the group consisting of a hydrogen atom, an alkyl group, a halogen atom, and an aromatic structure. In preferred embodiments, $R^{18}$ to $R^{23}$ are all hydrogen atoms or all fluorine atoms. In a more preferred embodiment, $R^{18}$ to $R^{23}$ are all hydrogen atoms.

In formula (9-4), $R^{24}$ to $R^{29}$ are the same as or different from each other and each represent at least one structure selected from the group consisting of a hydrogen atom, an alkyl group, a halogen atom, and an aromatic structure. In preferred embodiments, $R^{24}$ to $R^{29}$ are all hydrogen atoms, all fluorine atoms, or all chlorine atoms. In a more preferred embodiment, $R^{24}$ to $R^{29}$ are all hydrogen atoms.

In formula (9-5), $R^{30}$ to $R^{33}$, $R^{30'}$, and $R^{33'}$ are the same as or different from each other and each represent at least one structure selected from the group consisting of a hydrogen atom, an alkyl group, a halogen atom, and an aromatic structure. In preferred embodiments, $R^{30}$ to $R^{33}$, $R^{30'}$, and $R^{33'}$ are all hydrogen atoms, all fluorine atoms, or all chlorine atoms. In a more preferred embodiment, $R^{30}$ to $R^{33}$, $R^{30'}$, and $R^{33'}$ are all hydrogen atoms.

Preferred among formulas (9-1) to (9-5) is formula (9-4) or (9-5). Such a siloxane compound having a reactive carbon-carbon unsaturated bond at a side chain can react with, for example, a maleimide compound when the resin composition is cured, thereby being inhibited from emerging to the surface of the cured product. Thus, the cured product can have good appearance.

The constituent unit of formula (9) may suitably be a constituent unit represented by the following formula (9-6):

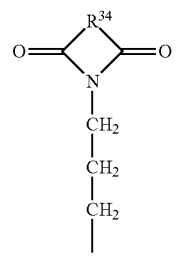

wherein $R^{34}$ represents at least one selected from the group consisting of an aromatic structure, a heterocyclic structure, and an alicyclic structure. That is, the siloxane compound in the present invention may suitably include a siloxane compound of average composition formula (6) in which X is a constituent unit of formula (9-6). $R^{34}$ in formula (9-6) is preferably the same as $R^9$ described for formula (9).

The siloxane compound is particularly preferably poly(γ-phthalimidopropylsilsesquioxane) ($R^{34}$ is a phenylene group), poly{γ-(hexahydro-4-methylphthalimido)-propylsilsesquioxane} ($R^{34}$ is a methylcyclohexylene group), poly{γ-(1,8-naphthalimido)propylsilsesquioxane} ($R^{34}$ is a naphthylidene group), poly{γ-(5-norbornene-2,3-imido)propylsilsesguioxane) ($R^{34}$ is a divalent norbornene group), or poly[(cis-4-cyclohexene-1,2-imido)-propylsilsesquioxane) ($R^{34}$ is a cyclohexenyl group).

The structure of these compounds can be measured and identified by $^1$H-NMR, $^{13}$C-NMR, and MALDI-TOF-MS.

Regarding the molecular weight of the siloxane compound, the number average molecular weight may suitably be 100 to 10000. If the siloxane compound is a polymer compound having a number average molecular weight of more than 10000, it may not be sufficiently miscible with the cyanate ester compound. If the number average molecular weight is less than 100, heat resistance and other properties may be insufficient. The number average molecular weight is more preferably 500 to 5000, still more preferably 1000 to 5000. The weight average molecular weight may suitably be 100 to 10000, more preferably 500 to 5000, still more preferably 1000 to 5000.

The molecular weight (number average molecular weight and weight average molecular weight) of the siloxane compound can be measured by gel permeation chromatography (GPC) according to the conditions described in EXAMPLES.

In the curable resin composition of the present invention, the amount of the siloxane compound present is preferably 30% to 350% by mass based on 100% by mass of the maleimide compound in the curable resin composition. The amount is more preferably 35% to 350% by mass, still more preferably 40% to 300% by mass.

The siloxane compound may be produced by any method, such as, for example, the following methods (I) and (II):

(I) a production method including imidizing an intermediate (including a siloxane compound) represented by the average composition formula X'aYbZcSiOd which has a siloxane bond and an amide bond-containing organic structure X' corresponding to the imide bond-containing organic structure X contained in the siloxane compound; and (II) a production method including hydrolyzing and condensing an intermediate including a siloxane compound that has an imide bond-containing organic structure corresponding to the imide bond-containing organic structure X contained in the siloxane compound, the imide bond-containing organic structure being bonded to a silicon atom and containing a hydrolyzable group.

<Inorganic Filler>

The curable resin composition of the present invention preferably further contains an inorganic filler. The inorganic filler may be any filler such as those used in conventional sealing materials for assembled boards. Examples include silica filler.

The amount of the inorganic filler present in the curable resin composition may suitably be 50% to 95% by mass, more preferably 60% to 93% by mass, still more preferably 70% to 90% by mass based on 100% by mass of the total curable resin composition. When such a large amount of the inorganic filler is used, for example, to produce an sealing material for assembled boards, warpage of the boards after curing can be sufficiently prevented.

<Other Components>

The curable resin composition of the present invention may also contain other components in addition to the above-described components, if necessary. Examples include curing agents, curing accelerators, inorganic fillers, volatile components such as organic solvents and diluents, flame retardants, reinforcing materials, coupling agents, stress relievers, release agents, stabilizers, colorants, plasticizers, flexibilizers, various rubbery materials, photosensitizers, and pigments. One or two or more of these may be used.

<Curable Resin Composition and Cured Product>

When the curable resin composition of the present invention is to be subjected to transfer molding or the like, the viscosity at 150° C. of the curable resin composition is preferably 0.01 to 60 Pa·s, depending on the molding method used. The curable resin composition having such an appropriate viscosity can be applied with excellent handleability, for example. The viscosity is more preferably 0.02 to 40 Pa·s. When the curable resin composition is cast at room temperature, it is preferred that the curable resin composition is liquid at room temperature and has a viscosity of 5 to 1000 Pa·s. This is because if the viscosity is too low, the inorganic filler may settle out, while if the viscosity is too high, the composition may not fill the uneven surfaces to be sealed. The viscosity is more preferably 10 to 500 Pa·s. The preferred range of the viscosity at 175° C. of the curable resin composition is also the same as the preferred range of the viscosity at 150° C. described above.

The viscosity of the curable resin composition can be measured using, for example, an E-type viscometer (produced by Brookfield) or a flow tester CFT-500D (produced by Shimadzu Corporation).

The curable resin composition of the present invention may be cured by any method. For example, it may be subjected to thermal curing to produce a cured product. The curing method is not particularly limited, and common thermal curing techniques may be used. For example, the thermal curing temperature may suitably be 70° C. to 250° C., more preferably 100° C. to 250° C. The curing time may suitably be 1 to 15 hours, more preferably 2 to 10 hours.

The cured product may suitably have a glass transition temperature of 180° C. or higher as determined by a thermal mechanical analyzer (DMA). Such a cured product is more suitable for, for example, electronic packaging materials such as sealing materials for assembled boards. The glass transition temperature is more preferably 190° C. or higher, still more preferably 195° C. or higher, particularly preferably 200° C. or higher.

The cured product has a significantly high glass transition temperature and excellent mechanical strength because it is produced from the curable resin composition of the present invention. Therefore, it is useful in various applications such as mounting applications, optical applications, opto device applications, display device applications, machine component applications, electric and electronic component applications, automobile component applications, and printing ink applications. Specifically, the cured product is preferably used in, for example, electronic packaging materials such as sealing materials, potting materials, underfill materials, conductive pastes, insulating pastes, die-bonding materials, and printing inks, and more preferably in electronic packaging materials. In particular, it is very useful for sealing materials for assembled boards.

Thus, another aspect of the present invention relates to an sealing material including the curable resin composition. The sealing material is particularly preferably a semiconductor sealing material. Preferred embodiments of the present invention also include semiconductor devices or printed wiring boards formed using the cured product.

The sealing material is a material used, for example, to seal semiconductor components, and may contain, if necessary, additives such as curing accelerators, stabilizers, release agents, coupling agents, colorants, plasticizers, flexibilizers, various rubbery materials, photosensitizers, fillers, flame retardants, and pigments, as long as such additives do not impair the effects of the present invention. It is desired that the sealing material is free from volatile components because a large amount of volatile components may cause a problem. The amount of volatile components based on 100% by mass of the sealing material is, for example, preferably 10% by mass or less, more preferably 5% by mass or less, still more preferably 3% by mass or less. Particularly preferably, the sealing material is substantially free from volatile components.

Advantageous Effects of Invention

In the curable resin composition of the present invention having the above-described features, the formation of carbamate compounds can be sufficiently reduced even though the composition includes a highly heat-resistant cyanate ester compound. When such a curable resin composition is used as an sealing material, the formation of voids and cracks can be reduced. Therefore, the curable resin composition is suitable for sealing materials, and in particular sealing materials for boards with electronic components or semiconductor chips mounted thereon or other similar applications which require particularly high heat resistance.

BRIEF DESCRIPTION OF DRAWINGS

FIG. 1-2 illustrates the results of an ultrasonic test of a semiconductor package including the resin composition of Comparative Example 1 as an sealing material after post-curing.

FIG. 2-1 illustrates the results of an ultrasonic test of a semiconductor package including the resin composition of Example 1 as an sealing material immediately after molding.

FIG. 2-2 illustrates the results of an ultrasonic test of a semiconductor package including the resin composition of Example 1 as an sealing material after post-curing.

DESCRIPTION OF EMBODIMENTS

Figure 1:
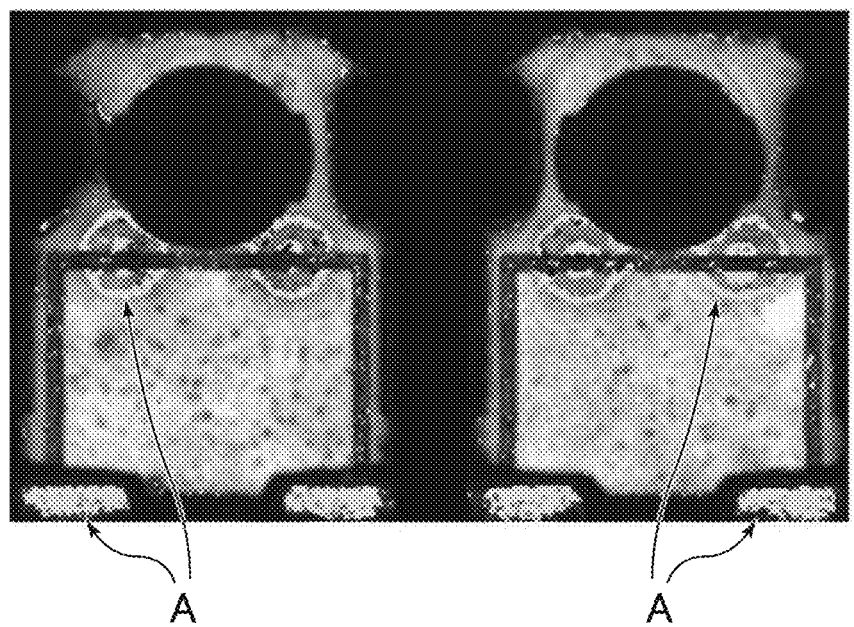
FIG. 1-1 illustrates the results of an ultrasonic test of a semiconductor package including the resin composition of Comparative Example 1 as an sealing material immediately after molding.

Hereinafter, the present invention is described in greater detail with reference to examples, but is not limited thereto. Unless otherwise specified, "part(s)" means "part(s) by weight", and "%" means "% by mass".

<Measurement of Molecular Weight>

The number average molecular weight and weight average molecular weight of siloxane compounds can be determined by gel permeation chromatography (GPC) under the following measurement conditions.

Measuring equipment: HLC-8120GPC (trade name, from Tosoh Corporation)

Molecular weight column: TSK-GEL GMHXL-L and TSK-GEL G5000HXL (both from Tosoh Corporation) connected in series Eluent: Tetrahydrofuran (THF)

Reference material for calibration curve: Polystyrene (from Tosoh Corporation)

Measuring method: An object to be measured was dissolved in THF to give a solids content of about 0.2% by mass, and the solution is filtered to obtain a filtrate as a measurement sample, which was then measured for molecular weight.

<Measurement of Glass Transition Temperature (Tg)>

The glass transition temperature of resin compositions was measured using a dynamic viscoelasticity measuring device (device name: DMA 7100, from Hitachi High-Tech Science Corporation). The measurement was carried out at a temperature in the range of $-100°$ C. to $400°$ C. and a rate of temperature increase of $5°$ C./min in a nitrogen atmosphere.

Synthesis Example 1

Synthesis of poly{γ-(5-norbornene-2,3-imido)-propylsilsesquioxane}

A 500 mL four-necked flask equipped with a stirrer, a temperature sensor, and a condenser was charged with 87.9 g of diglyme previously dried with molecular sieves and 142.5 g of 3-aminopropyltrimethoxysilane, and they were heated to $100°$ C. with stirring under dry nitrogen flow to remove moisture in the system. Then, while the temperature of the reaction solution was still maintained at $1000°$ C., 131.8 g of 5-norbornene-2,3-dicarboxylic anhydride was introduced in four portions over 30 minutes. Nine hours after the completion of the introduction, high performance liquid chromatography was performed to confirm complete consumption of 5-norbornene-2,3-dicarboxylic anhydride.

Subsequently, 42.9 g of deionized water was introduced in one portion, and the mixture was heated to reflux by-product methanol in the condenser, and then maintained at $95°$ C. for 10 hours. Thereafter, the condenser was replaced with a partial condenser and heating was started again. The temperature of the reaction solution was allowed to reach $120°$ C. over 3 hours while by-product methanol and condensed water were recovered. At the time when the temperature reached $120°$ C., 0.65 g of cesium carbonate was introduced and heating was directly started. The temperature was allowed to reach $160°$ C. over 3 hours while condensed water was recovered, and this temperature was maintained for 2 hours, followed by cooling to room temperature to give a reaction product A.

The reaction product A was a dark brown, highly viscous liquid with a non-volatile content of 70.0%, and had a number average molecular weight of 2340 and a weight average molecular weight of 2570 as determined by GPC.

The reaction product was analyzed by $^1$H-NMR and $^{13}$C-NMR to confirm that it contained a compound (siloxane compound 1) represented by the following formula (10).

$^1$H-NMR: 0.25-0.45 (bs, 2H), 1.2-1.45 (bs, 2H), 1.47 (dd, 2H), 3.0-3.2 (bs, 4H), 3.4-3.6 (bs, 2H), 5.8-6.0 (bs, 2H)
$^{13}$C-NMR: 9.7, 21.5, 40.4, 44.9, 45.7, 50.1, 134.2, 178.0

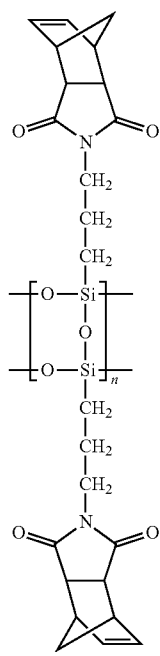

(10)

Synthesis Example 2

Synthesis of poly{(cis-4-cyclohexene-1,2-imido)-propylsilsesquioxane}

A reaction product B was prepared as in Synthesis Example 1, except that 122.2 g of cis-4-cyclohexene-1,2-dicarboxylic anhydride was used instead of 131.8 g of 5-norbornene-2,3-dicarboxylic anhydride in Synthesis Example 1. The reaction product B was a dark brown, highly viscous liquid with a non-volatile content of 70.0%, and had a number average molecular weight of 2041 and a weight average molecular weight of 2838 as determined by GPC. The reaction product was analyzed by $^1$H-NMR and $^{13}$C-NMR to confirm that it contained a compound (siloxane compound 2) represented by the following formula (11).

$^1$H-NMR: 0.25-0.55 (bs, 2H), 1.3-1.5 (bs, 2H), 2.0-2.5 (dd, 4H), 2.9-3.1 (bs, 2H), 3.2-3.35 (bs, 2H), 5.65-5.8 (bs, 2H)
$^{13}$C-NMR: 10.0, 21.0, 23.8, 39.0, 41.1, 127.8, 180.5

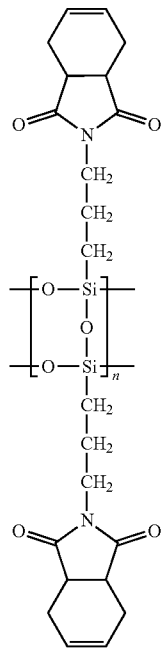

(11)

Examples 1 to 4 and Comparative Examples 1 and 2

The materials were weighed as shown in Table 1 below, and then kneaded using a hot roll mill to give a compound. The temperature of the surface of the milling roll was set at 72° C., and the kneading time was set at 5 minutes. The compound was ground into powder with a particle size of 1 mm or smaller using a grinding mill and then formed into tablets having a diameter of 18 mm and a weight of 7 g using a tablet machine.

The tablets of the resin composition were evaluated for sealing material properties as described below. Furthermore, a semiconductor package was prepared, and the degree of separation of the sealing material was determined for the semiconductor package to evaluate the reliability of the sealing material as described below.

<Evaluation of Sealing Material Properties (Handleability)>

The tablets of the resin composition were put in a plastic bag and left at 40° C. for 24 hours. Then, the tablets were taken out from the bag, and their conditions were observed. Tablets that were initially distorted in shape and fused to each other so that they were not separable from each other were rated "bad"; tablets that adhered to each other but were not distorted in shape and were easily separable from each other were rated "good"; and tablets that showed no adhesion and remained completely the same as before being left under the above conditions were rated "excellent".

In addition, the sealing material was sandwiched between hot plates maintained at 180° C. and press molded at 5 MPa for 300 seconds to prepare a 2 mm thick sheet. The sheet was left in an oven at 270° C. for 5 hours to prepare a molded sheet. The dynamic viscoelasticity of the molded sheet was measured to determine the Tg. The measurement was carried out using a DMA7100 device produced by Hitachi High-Tech Science Corporation at temperatures of −100° C. to 400° C. under nitrogen gas flow at a scanning rate of 5° C./min.

<Preparation of Semiconductor Package>

A TO247 type package was prepared by insert molding of a copper lead frame using a low pressure transfer molding machine. The molding conditions were set as follows: a mold temperature of 180° C., a clamping pressure of 294 kN, a preheating time of 5 seconds, an injection pressure of 15 kN, an injection rate of 0.9 mm/s, a transfer time of 18 seconds, and a curing time of 300 seconds.

In Examples 1 to 4 where the evaluation conditions of the post-curing and the heat cycle test in reliability evaluation described below were made severer to increase thermal stress generated in the package, a 1.5 mm □ SiC Schottky barrier diode was die-bonded on a pad using a high temperature lead solder, and the diode element and a terminal were wire-bonded to each other using a 350 μm diameter aluminum wire.

<Reliability Evaluation>

In order to examine the influence of the residual internal stress on the inner structure of the package when the degree of cure of the sealing material was increased by post-curing, the package was left in an inert oven at 250° C. under nitrogen flow for 5 hours.

Moreover, a heat cycle test was performed to examine the influence on the inner structure of the package caused by the internal stress generated when the package was repeatedly exposed to cold and hot environments. The conditions of the heat cycle test were as follows: the lower limit for cooling mode was set at −50° C. for 30 minutes; the upper limit for heating mode was set at +225° C. for 30 minutes; and the cooling/heating time was about 3 minutes.

The inner structure of the package was determined using an ultrasonic tester (FineSAT III, from Hitachi Power Solutions Co., Ltd.), and rated "bad" if separation was observed at the interface between the integrated components in the package and the sealing material; "fair" if no separation was observed but many non-uniform structures such as voids or gels were observed; and "excellent" if no separation and only a small number of non-uniform structures were observed.

Figures 1, 2:
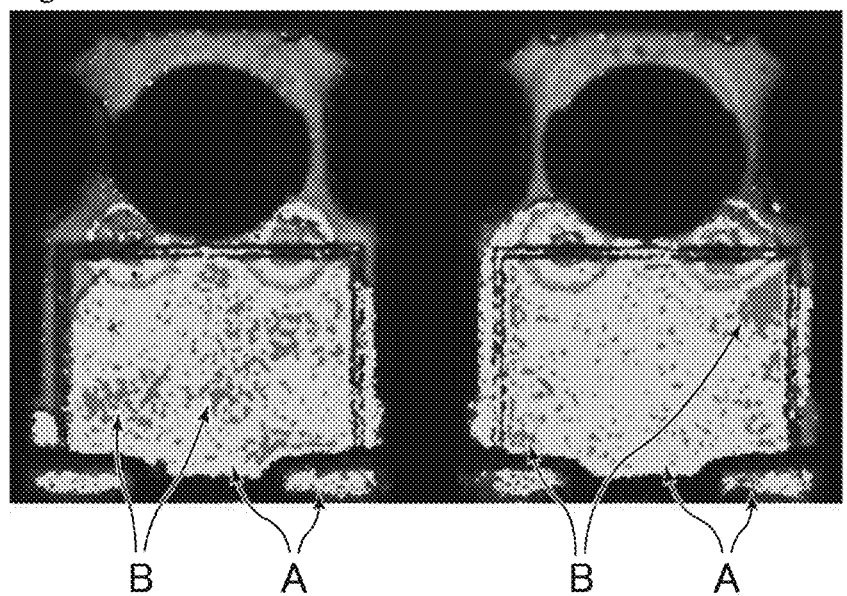
Figures 1, 2:
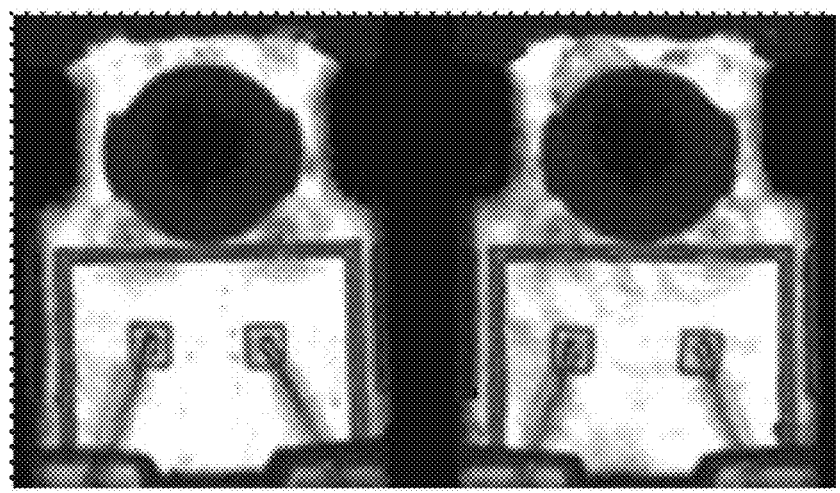
Figure 2:
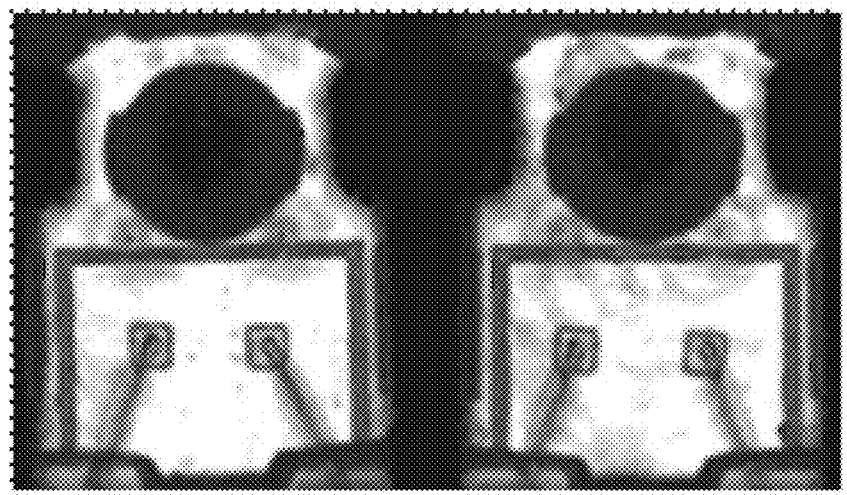

The results of the reliability evaluation were shown in Table 1, and the results of the ultrasonic test were shown in FIGS. 1-1 to 2-2. In FIGS. 1-1 and 1-2, the portions with a color indicated by A mean that separation occurred at the interface between the integrated components in the package and the sealing material so that a void was formed, while the portions with a color indicated by B mean that a void larger than in the portions with a color indicated by A was formed.

TABLE 1

| | | Example 1 | Comparative Example 1 | Example 2 | Comparative Example 2 | Example 3 | Example 4 |
|---|---|---|---|---|---|---|---|
| Formulation of resin (g) | Cyanate ester compound | 19.14 | 19.43 | 9.84 | 9.99 | 8.41 | 3.71 |
| | Carbodiimide compound | 0.29 | 0 | 0.29 | 0 | 0.15 | 0.15 |
| | Maleimide compound | 0 | 0 | 9.30 | 9.44 | 4.63 | 8.20 |
| | Siloxane compound 1 | 0 | 0 | 0 | 0 | 6.24 | 0 |
| | Siloxane compound 2 | 0 | 0 | 0 | 0 | 0 | 7 |
| | Co(acac)$_2$ | 0.16 | 0.16 | 0.16 | 0.16 | 0.16 | 0.16 |
| | t-Butylphenol | 0.33 | 0.33 | 0.33 | 0.33 | 0.33 | 0.33 |
| | Carbon black | 0.34 | 0.34 | 0.34 | 0.34 | 0.34 | 0.34 |
| | Carnauba wax | 0.35 | 0.35 | 0.35 | 0.35 | 0.35 | 0.35 |
| | Silane coupling agent | 0.24 | 0.24 | 0.24 | 0.24 | 0.24 | 0.24 |
| | Silica | 69.65 | 69.65 | 69.65 | 69.65 | 69.65 | 69.65 |
| | Magnesium hydroxide | 7.00 | 7.00 | 7.00 | 7.00 | 7.00 | 7.00 |
| | Silicone oil | 2.50 | 2.50 | 2.50 | 2.50 | 2.50 | 2.50 |
| Evaluation of encapsulant properties | Evaluation of handleability | Bad | Bad | Good | Good | Excellent | Excellent |
| | Tg (DMA, ° C.) | 320 | 320 | 335 | 335 | 400 or higher | 400 or higher |
| Reliability evaluation (conditions inside semiconductor package) | Immediately after molding | Excellent | Fair | Excellent | Fair | Excellent | Excellent |
| | After post-curing | Excellent | Bad | Excellent | Bad | Excellent | Excellent |
| | After heat cycle test (500 cycles) | Excellent | — | Excellent | — | Excellent | Excellent |

The cyanate ester compound, the maleimide compound, the carbodiimide compound, and the silane coupling agent shown in Table 1 are as follows.

Cyanate ester compound: A phenol novolac-type cyanate ester compound represented by formula (12) below (Primaset PT30, from Lonza Japan)

Maleimide compound: A bismaleimide compound having a structure represented by formula (13) below (bismaleimide BMI80, from K.I Chemical Industry Co., Ltd.)

Carbodiimide compound: An aliphatic polycarbodiimide compound (product name "CARBODILITE V-05", from Nisshinbo Chemical Inc.)

Silane coupling agent: N-phenyl-3-aminopropyltrimethoxysilane (product name "KBM573", from Shin-Etsu Chemical Co., Ltd.)

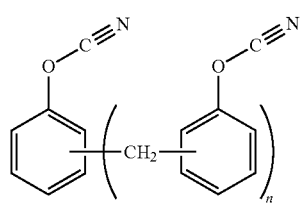

(12)

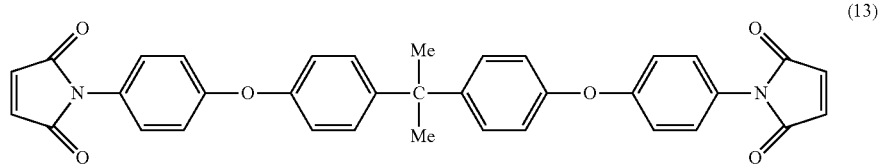

(13)

REFERENCE SIGNS LIST

A: the portion where a void is formed
B: the portion where a void larger than in the portion A is formed

The invention claimed is:

1. A curable resin composition, comprising:
a cyanate ester compound;
a maleimide compound; and
a dehydrating agent,
wherein the dehydrating agent comprises a carbodiimide compound; and
a siloxane compound represented by the following average composition formula (6):

$$X_a Y_b Z_c SiO_d \quad (6),$$

wherein each X is the same or different and represents an organic structure containing an imide bond; each Y is the same or different and represents at least one selected from the group consisting of a hydrogen atom, a hydroxy group, a halogen atom, and an OR group; each Z is the same or different and represents an organic group containing no imide bond; each R is the same or different and represents at least one selected from the group consisting of an alkyl group, an acyl group, an aryl group, and an unsaturated aliphatic residue, and may have a substituent; a, b, and c each represent 0 or a number of less than 3; d represents a number of less than 2, excluding 0; and $a+b+c+2d=4$,
wherein the cyanate ester compound is represented by the following formula (1):

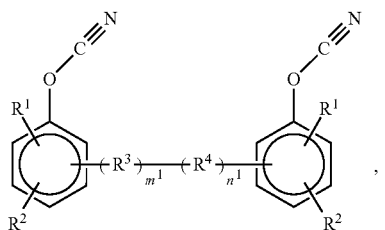

(1)

wherein $R^1$ and $R^2$ are the same as or different from each other and each represents a hydrogen atom, a C1-C4 alkyl group, a halogenated alkyl group, or a halogen group (X); each $R^3$ is the same or different from each other and represents an organic group represented by any of the chemical formulas below; each $R^4$ is the same as or different from each other and represents an organic group represented by the chemical formula below; $m^1$ is 0 or 1; and $n^1$ represents an integer of 0 to 10

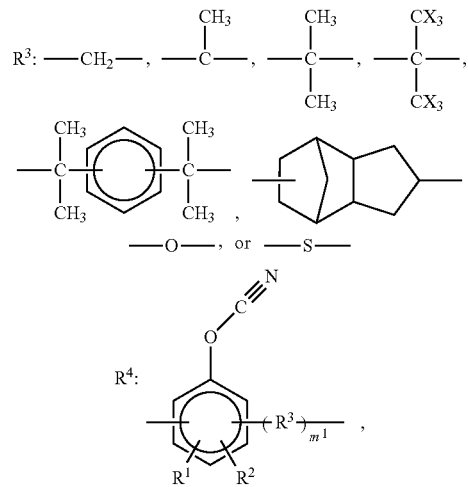

the amount of the cyanate ester compound is from 15% to 36% by mass based on 100% by mass of the total organic component in the curable resin composition,
the amount of the carbodiimide compound present is from 1.5% to 5% by mass based on 100% by mass of the cyanate ester compound in the curable resin composition, and
the amount of the siloxane compound is from 74% to 189% by mass based on 100% by mass of the cyanate ester compound in the curable resin composition.

2. The curable resin composition according to claim 1, wherein the dehydrating agent is polycarbodiimide.

3. A sealing material, comprising the curable resin composition according to claim 1.

4. An automobile component, comprising a cured product of the curable resin composition according to claim 1.

5. The curable resin composition according to claim 1, wherein the carbodiimide compound is at least one selected from the group consisting of N,N'-diphenylcarbodiimide, N,N'-di-2,6-dimethylphenylcarbodiimide, N,N'-di-o-toluylcarbodiimide, N,N'-di-p-toluylcarbodiimide, N,N'-di-p-nitrophenylcarbodiimide, N,N'-di-p-aminophenyl-carbodiimide, N,N'-di-p-hydroxyphenylcarbodiimide, N,N'-di-p-chlorophenylcarbodiimide, N,N'-di-o-chlorophenyl-carbodiimide, N,N'-di-3,4-dichlorophenylcarbodiimide, N,N'-di-2,5-dichlorophenylcarbodiimide, N,N'-p-phenylene-bis-o-toluylcarbodiimide, N,N'-p-phenylene-bis-dicyclohexylcarbodiimide, N,N'-p-phenylene-bis-di-p-chlorophenylcarbodiimide, N,N'-2,6,2',6'-tetraisopropyl-diphenylcarbodiimide, N,N'-ethylene-bis-diphenylcarbodiimide, N-toluyl-N'-cyclohexylcarbodiimide, N,N'-di-2,6-diisopropylphenylcarbodiimide, N,N'-di-2,6-di-tert-butylphenylcarbodiimide, N-toluyl-N'-phenylcarbodiimide, N,N'-benzylcarbodiimide, N-octadecyl-N'-phenylcarbodiimide, N-benzyl-N'-phenylcarbodiimide, N-octadecyl-N'-tolylcarbodiimide, N-cyclohexyl-N'-tolylcarbodiimide, N-phenyl-N'-tolylcarbodiimide, N-benzyl-N'-tolylcarbodiimide, N,N'-di-o-ethylphenylcarbodiimide, N,N'-di-p-ethylphenyl-carbodiimide, N,N'-di-o-isopropylphenylcarbodiimide, N,N'-di-p-isopropylphenylcarbodiimide, N,N'-di-o-isobutylphenyl-carbodiimide, N,N'-di-p-isobutylphenylcarbodiimide, N,N'-di-2,6-diethylphenylcarbodiimide, N,N'-di-2-ethyl-6-isopropylphenylcarbodiimide, N,N'-di-2-isobutyl-6-isopropylphenylcarbodiimide, N,N'-di-2,4,6-trimethylphenyl-carbodiimide, N,N'-di-2,4,6-triisopropylphenylcarbodiimide, N,N'-di-2,4,6-triisobutylphenylcarbodiimide, poly(4,4'-diphenylmethanecarbodiimide), poly(3,3'-dimethyl-4,4'-diphenylmethanecarbodiimide), poly(naphthylene-carbodiimide), poly(p-phenylenecarbodiimide), poly(m-phenylenecarbodiimide), poly(tolylcarbodiimide), poly(methyldiisopropyl-phenylenecarbodiimide), poly(triethylphenylenecarbodiimide), poly(triisopropylphenylenecarbodiimide), and a (poly) carbodiimide prepared using tetramethylxylylene diisocyanate as feedstock.

6. The curable resin composition according to claim 1, wherein the carbodiimide compound is a polycarbodiimide prepared using tetramethylxylylene diisocyanate as feedstock.

\* \* \* \* \*